(12) United States Patent
Lim et al.

(10) Patent No.: US 8,030,698 B2
(45) Date of Patent: Oct. 4, 2011

(54) NONVOLATILE MEMORY DEVICE

(75) Inventors: Jong-Ho Lim, Gyeonggi-do (KR);
Choong-Ho Lee, Gyeonggi-dol (KR);
Hye-Jin Cho, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 323 days.

(21) Appl. No.: 12/437,773

(22) Filed: May 8, 2009

(65) Prior Publication Data
US 2009/0315094 A1 Dec. 24, 2009

(30) Foreign Application Priority Data

Jun. 24, 2008 (KR) .................. 10-2008-0059759

(51) Int. Cl.
*H01L 29/788* (2006.01)
(52) U.S. Cl. ............ 257/314; 257/E27.026; 365/185.26
(58) Field of Classification Search .................. 257/211, 257/314–316, 326, E29.3, E21.691, E27.026, 257/E27.081, E29.226; 365/185.18, 185.03, 365/185.06, 185.26
See application file for complete search history.

(56) References Cited

U.S. PATENT DOCUMENTS
2008/0023747 A1 * 1/2008 Park et al. ..................... 257/314

FOREIGN PATENT DOCUMENTS
| KR | 100655439 B1 | 12/2006 |
| KR | 100673019 B1 | 1/2007 |
| KR | 100689842 B1 | 2/2007 |

* cited by examiner

*Primary Examiner* — Evan Pert
*Assistant Examiner* — Selim Ahmed
(74) *Attorney, Agent, or Firm* — Myers Bigel Sibley & Sajovec

(57) ABSTRACT

Provided is a nonvolatile memory device having a three dimensional structure. The nonvolatile memory device includes a plurality of stacked semiconductor layers and a plurality of memory cell transistors which is formed on each of a plurality of semiconductor layers and serially connected. Memory cell transistors disposed on different semiconductor layers are serially connected to include one cell string forming a current path in a plurality of semiconductor layers, a first selection transistor serially connected to one edge portion of the cell string and a second selection transistor serially connected to the other edge portion of the cell string.

20 Claims, 10 Drawing Sheets

NONVOLATILE MEMORY DEVICE

CROSS-REFERENCE TO RELATED APPLICATIONS

This U.S. non-provisional patent application claims priority under 35 U.S.C. §119 of Korean Patent Application No. 2008-59759, filed on Jun. 24, 2008, the entire contents of which are hereby incorporated by reference.

BACKGROUND

Exemplary embodiments relate to nonvolatile memory devices, and more particularly, to flash memory devices.

Generally, nonvolatile memory devices can electrically erase data and program data. The nonvolatile memory device may store data even when a power supply is interrupted. The use of a nonvolatile memory device in various fields may be increasing.

The nonvolatile memory devices may constitute various cell transistors and may be classified into a NAND type and a NOR type according to a cell array structure. A nonvolatile memory cell transistor of NAND type may realize a benefit of a higher integration and a NOR memory cell transistor of NOR type may realize a benefit of a higher speed.

A NAND type device may be advantageous regarding integration due to a cell string structure that provides multiple memory cell transistors that may be serially connected to one another. Also, data stored in memory cell transistors may be simultaneously changed in a NAND type nonvolatile memory device, which may result in a speed of updating data of the NAND type nonvolatile memory device that is faster than that of the NOR type nonvolatile memory device. A NAND type nonvolatile memory device may be used in a portable electronic device having need of mass storage such as a digital camera or a MP3 player because of a high integration and a high speed of updating data.

Benefits from improvements of NAND type nonvolatile memory devices may be continuously sought after.

SUMMARY

Exemplary embodiments of the present invention are directed to nonvolatile memory devices. Such device may include multiple stacked semiconductor layers and a cell string including multiple memory cell transistors that are formed on each of the stacked semiconductor layers and that are serially connected. Some embodiments provide that the memory cell transistors disposed on different ones of the stacked semiconductor layers and are serially connected to form one current path in the stacked semiconductor layers. Devices may include a first selection transistor that is serially connected to a first end portion of the cell string and a second selection transistor that is serially connected to the other end portion of the cell string.

Some embodiments include a contact plug disposed between ones of the stacked semiconductor layers to serially connect memory cell transistors disposed on different ones of the stacked semiconductor layers. Some embodiments provide that the contact plug is inserted into a semiconductor layer disposed on an upper portion of the contact plug and is in contact with a lower portion of an impurity region of memory cell transistor disposed in the semiconductor layer. Some embodiments include an insulating layer formed around the contact plug inserted into the semiconductor layer.

In some embodiments, the first and second selection transistors are disposed on a same one of the stacked semiconductor layers. Some embodiments provide that at least one of the stacked semiconductor layers includes at least a portion of the memory cell transistors serially connected without including the first and second selection transistors. Some embodiments include an insulating layer pattern formed on the one of the stacked semiconductor layers on which the first and second selection transistors are disposed and between the first and second transistors. In some embodiments, the first and second selection transistors are adjacently disposed.

Some embodiments provide that the first and second selection transistors are disposed on different ones of the stacked semiconductor layers. In some embodiments, the first and second selection transistors are disposed on a same vertical line. In some embodiments, the first and second selection transistors are disposed on the highest layer and the lowest layer of the stacked semiconductor layers, respectively. Some embodiments provide that one of the semiconductor layers is disposed between the highest layer and the lowest layer and includes multiple ones of the memory cell transistors serially connected.

Some embodiments include a common source line connected to the first selection transistor and a bit line contact plug connected to the second selection transistor, such that a height of the common source line and/or the bit line contact plug is less than a distance between ones of the stacked semiconductor layers. Some embodiments provide that the common source line and the bit line contact plugs are connected to different impurity regions formed in different ones of the stacked semiconductor layers, respectively. In some embodiments, the common source line and the bit line contact plugs are disposed on a same vertical line.

Some embodiments provide that the common source line and the bit line contact plugs are connected to impurity regions formed in a same one of the stacked semiconductor layers. Some embodiments include multiple cell strings that are arranged in mirror symmetry relative to one another. In some embodiments, the adjacent cell strings arranged in mirror symmetry share the common source line and the bit line contact plug.

Some embodiments of the present invention include nonvolatile memory devices that include multiple stacked semiconductor layers including multiple cell string regions. In some embodiments, each of the cell string regions includes one cell string including multiple memory cell transistors which are formed in each of the stacked semiconductor layers and that are serially connected. The memory cell transistors may be disposed on different ones of the semiconductor layers being serially connected to form one current path in the multiple semiconductor layers. Devices may include a first selection transistor that is serially connected to one edge portion of the cell string and a second selection transistor that is serially connected to the other edge portion of the cell string.

Some embodiments provide that the first and second selection transistors are disposed on a center of the cell string region. Some embodiments include a contact plug which is disposed on an edge of the cell string region to serially connect memory cell transistors of different semiconductor layers.

BRIEF DESCRIPTION OF THE FIGURES

The accompanying figures are included to provide a further understanding of the present invention, and are incorporated in and constitute a part of this specification. The drawings

DETAILED DESCRIPTION OF THE EMBODIMENTS

Figure 1:
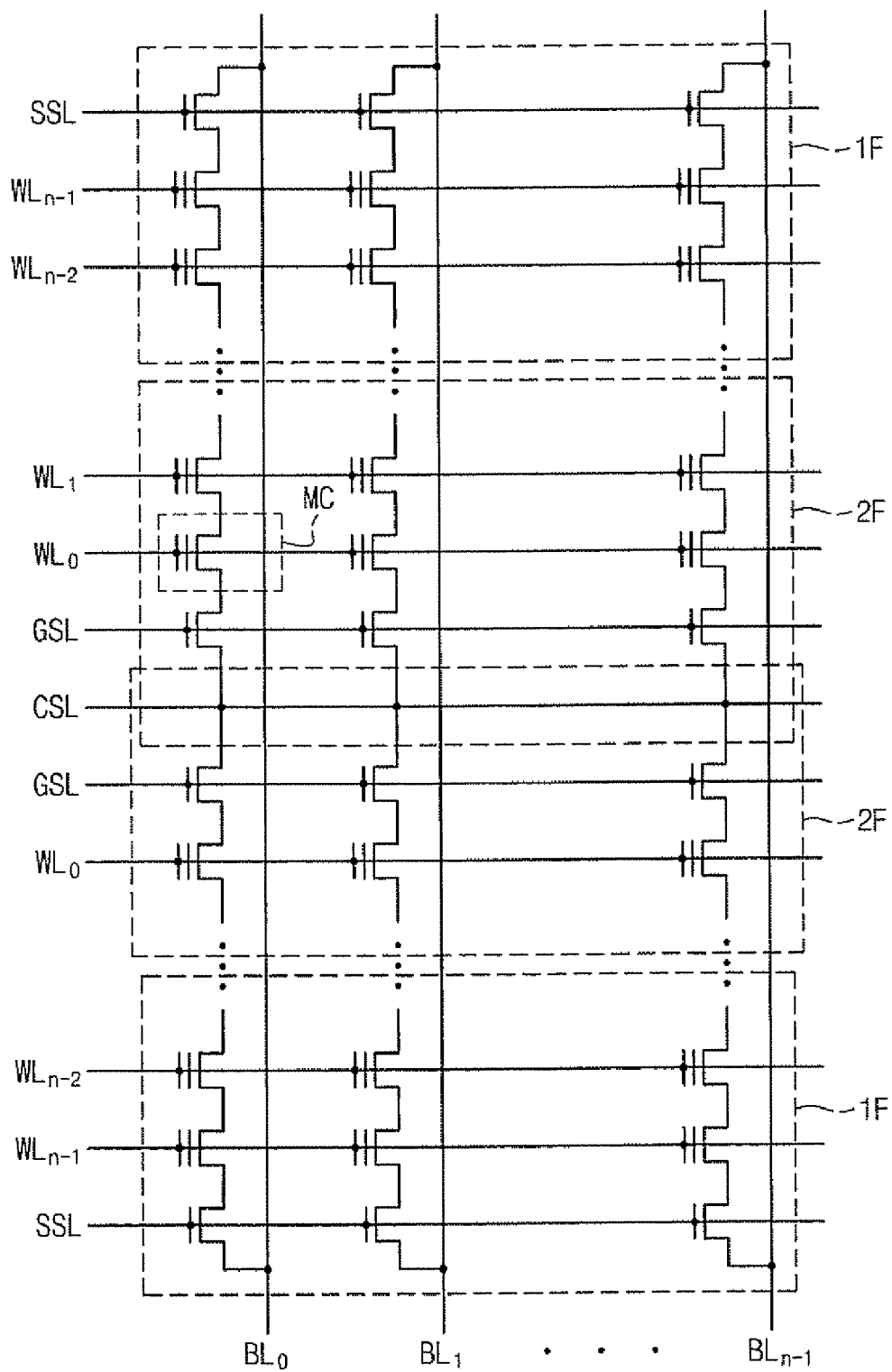
FIG. 1 is a circuit diagram of a nonvolatile memory device according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art.

It should be construed that forgoing general illustrations and following detailed descriptions are exemplified and an additional explanation of claimed inventions is provided.

Reference numerals are indicated in detail in some embodiments of the present invention, and their examples are represented in reference drawings. Throughout the drawings, like reference numerals are used for referring to the same or similar elements in the description and drawings.

Figure 2:
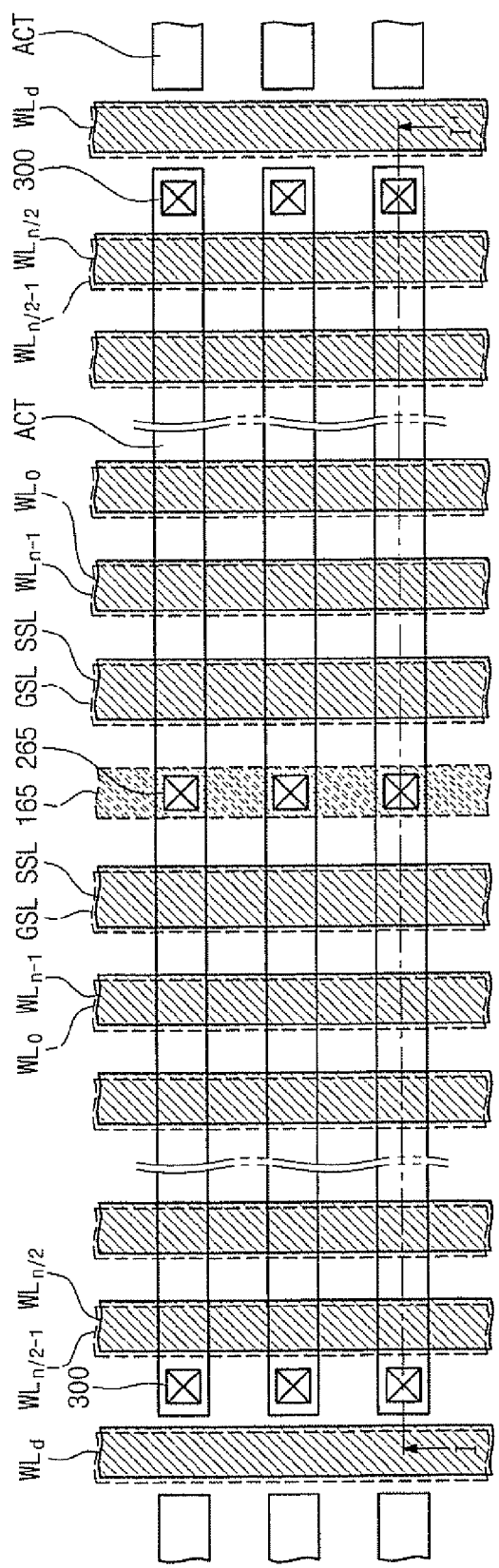
FIG. 2 is a top plan view of a nonvolatile memory device according to some embodiments of the present invention.
Figure 3:
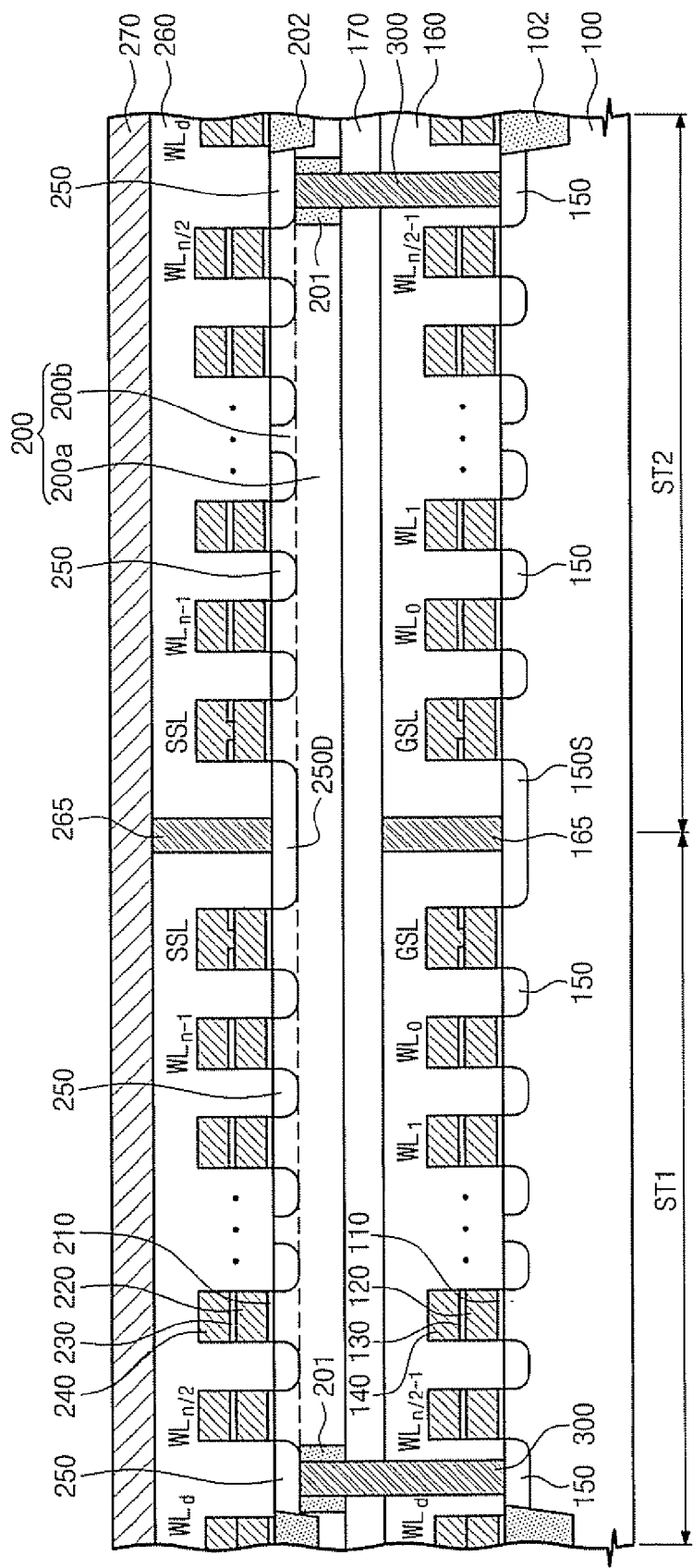
FIG. 3 is a cross sectional view of a nonvolatile memory device taken along the lone I-I' of FIG. 2 according to some embodiments of the present invention.

First, referring to FIGS. 1 through 3, a nonvolatile memory device according to some embodiments of the present invention will be described in detail. FIG. 1 is a circuit diagram of a nonvolatile memory device according to some embodiments of the present invention. FIG. 2 is a top plan view of a nonvolatile memory device according to some embodiments of the present invention. FIG. 3 is a cross sectional view of a nonvolatile memory device taken along the line I-I' of FIG. 2.

Referring to FIG. 1, a NAND type nonvolatile memory device according to some embodiments of the present invention includes a cell array composed of a plurality of cell strings. Each of the cell strings may include a plurality of memory cell transistors (MC). A first selection transistor and a second selection transistor may be serially connected to both ends of each of the cell strings, respectively. Some embodiments provide that a string selection transistor is connected to one end of a cell string and a ground selection transistor is connected to the other end of a cell string. In some embodiments, a string selection transistor, memory cell transistors and a string selection transistor are serially connected to one another between a bit line (BL) and a common source line (CSL).

In some embodiments of the present invention, one cell string includes n quantity of memory cell transistors (MC). In some embodiments, n is a positive number and may be a multiple of 8.

A cell array may include n quantity of word lines (WLn) between a string selection line (SSL) and a ground selection line (GSL). A cell array may includes bit lines (BLn) crossing the word lines (WLn). Some embodiments provide that the bit lines (BLn) are connected to drains of string selection transistors. Sources of ground selection transistors connected to each of cell strings are connected to form a common source line (CSL).

In some embodiments, mutually different cell transistors may have a structure symmetrically disposed with respect to a common source line (CSL). Some embodiments provide that mirror symmetrically arranged cell strings may share a bit line (BL).

Some embodiments provide that the quantity of memory cell transistors (MC) constituting one cell string is increased in order to increase a memory capacity of a nonvolatile memory device. Accordingly, as the quantity of memory cell transistors (MC) increases, a size of a nonvolatile memory device may increase. In some embodiments of the present invention, serially connected memory cell transistors (MC)

constituting multiple cell strings may be disposed on respective ones of a plurality of semiconductor layers. Thus, even though a memory capacity of a nonvolatile memory device may increase, an increase of an area of a nonvolatile memory device may be prevented.

Here, dispositions of memory cell transistors (MC) constituting one cell string may differ depending on positions of string selection transistors of both ends of a cell string. In this regard, each of the semiconductor layers may include a portion of memory cell transistors (MC) constituting one cell string. In some embodiments, contact plugs may be disposed between the semiconductor layers in order to serially connect the cell strings of memory cell transistors (MC) that are disposed on the different layers.

According to the quantity of semiconductor layers included in a nonvolatile memory device, a division unit (1F, 2F) of one cell string may be defined. When two of semiconductor layers are included, one cell string may be divided into two parts which may be disposed on respective ones of the semiconductor layers.

Hereinafter, referring to FIGS. 2 and 3, a nonvolatile memory device according to some embodiments of the present invention will be described in detail. In some embodiments of the present invention, a nonvolatile memory device may include multiple cell string regions that may each include one cell string having multiple memory cell transistors that are serially connected. Some embodiments provide that each cell string may include a string selection transistor and a ground selection transistor.

A nonvolatile memory device according to some embodiments of the present invention includes a plurality of semiconductor layers 100 and 200, which are stacked. In some embodiments of the present invention, the first and second semiconductor layers 100 and 200 may be depicted as a laminated structure. However, embodiments of the present invention are not limited to two semiconductor layers. For example, some embodiments provide that a structure may include more than two semiconductor layers that are stacked.

The first semiconductor layer 100 may be a single crystalline silicon wafer and/or a single crystalline epitaxy layer. The first semiconductor layer 100 may include an active region (ACT) of a line shape defined by a device isolation layer 102. In some embodiments, the active regions (ACT) may be disposed in parallel to one another and may have a predetermined distance therebetween. Some embodiments provide that the device isolation layer 102 is formed of an insulating material and electrically insulates spaces between the active regions (ACT).

A plurality of word lines (WLn) crossing the active regions (ACT), and a string selection line (SSL) and/or a ground selection line (GSL) may be positioned on the first semiconductor layer 100. Some embodiments provide that a string selection line (SSL) and/or a ground selection line (GSL) may be positioned on the first semiconductor 100 of the plurality of stacked semiconductor layers 100 and 200. In some embodiments of the present invention, a ground selection line (GSL) is positioned with a plurality of the word lines (WLn) on the first semiconductor layer 100. However, embodiments of the present invention are not so limited. For example, some embodiments provide that a ground selection line (GSL) is positioned on a layer other than the first semiconductor layer 100. A string selection line (SSL) may be positioned on the first semiconductor layer 100.

In some embodiments, a quantity n/2 memory cell transistors in a cell string comprised of n quantity of memory cell transistors may be disposed on the first semiconductor layer 100. That is, n/2 quantity of word lines ($WL_0$-$WL_{n/2-1}$) may be disposed on the first semiconductor layer 100.

Multiple word lines ($WL_0$-$WL_{n/2-1}$) may include a gate pattern by stacking a tunnel insulating layer 110, a floating gate 120, an intergate insulating layer 130 and/or a control gate 140. In some embodiments, a ground selection line (GSL) may have the same structure as the gate pattern of the word line (WLn). Some embodiments provide that the ground selection line (GSL) may have a gate pattern having a structure resulting from the removal of all and/or a portion of integrate insulating layer 130.

Some embodiments provide that a plurality of word lines (WLn) may have gate patterns formed by stacking a charge tunneling layer, a charge blocking layer and/or a gate.

In some embodiments, impurity regions 150 may be formed the first semiconductor layer 100 disposed between word lines ($WL_0$-$WL_{n/2-1}$) and a ground selection line (CSSL). In this manner, a plurality of memory cell transistors and a ground selection transistor (GSL) may be electrically connected to one another through the impurity regions 150 on the first semiconductor layer 100.

An impurity region 150S of one side of a ground selection line (GSL) may be connected to a common source line 165 and may function as a source electrode. A contact plug 300 may be connected to an impurity region 150 of one side of one word line ($WL_{n/2-1}$) among a plurality of word lines ($WL_0$-$W_{n/2-1}$) and may be disposed on the first semiconductor layer 100.

In some embodiments, the contact plug 300 extends vertically from an impurity region 150 formed in the first semiconductor layer 100 to an impurity region 250 formed in the second semiconductor layer 200. More specifically, some embodiments provide that the contact plug 300 penetrates a portion of the second semiconductor layer 200 and that a top surface of the contact plug 300 is in contact with an impurity region 250 formed in the second semiconductor layer 200.

In some embodiments, the contact plug 300 may be disposed on an edge of one cell string region (ST1). Some embodiments provide that the contact plug 300 may be composed of metal material having a low resistance. For example, the contact plug 300 may be composed of at least one of tungsten, titanium, tantalum, a tungsten nitride layer, a titanium nitride layer and/or a tantalum nitride layer, among others.

The word lines ($WL_0$-$WL_{n/2-1}$) and the ground selection (GSL) on the first semiconductor layer 100 may be covered with a first interlayer insulating layer 160 and a common source line 165 connected to an impurity region of one side of the ground selection line (GSL) may be formed in the first interlayer insulating layer 160. The common source line 165 may be commonly connected to source electrodes of ground selection transistors (GSL) that are connected to each of a plurality of cell strings. The common source line 165 may include a substantially linear configuration in the first interlayer insulating layer 160. In some embodiments, the common source line 165 may be formed by patterning gate conductive layers that are stacked during a formation of word lines.

The common source line 165 may be disposed in the first interlayer insulating layer 160 and may not extend to a position higher than a top surface of the first interlayer insulating layer 160. In this regard, the common source line 165 may have a height that is less than a distance between the first and second semiconductor layers 100 and 200.

The common source line 165 and a second interlayer insulating layer 170 insulating the second semiconductor layer 200 may be disposed on the first interlayer insulating layer 160. The second semiconductor layer 200 may be disposed on the second interlayer insulating layer 170.

The second semiconductor layer 200 may be comprised of a sub semiconductor layer 200a that may be formed by bonding a single crystalline silicon wafer with the second interlayer insulating layer 170 and an epitaxy layer 200b that may be formed through an epitaxial process using the sub semiconductor layer 200a as a seed layer. Some embodiments provide that active regions having the same disposition structure as the active regions of the first semiconductor layer 100 may be defined in the second semiconductor layer 200. In some embodiments, a device isolation layer 202 defining the active regions of the second semiconductor layer 200 may penetrate the second semiconductor layer 200.

A portion of the contact plug 300 electrically connecting the impurity regions 150 and 250 of the first and second semiconductor layers 100 and 200 to each other may penetrate the sub semiconductor layer 200a of the second semiconductor layer 200. An insulating layer 201 may be formed at a portion where the sub semiconductor layer 200a and the contact plug 300 are in contact with each other to insulate an electrical connection between the sub semiconductor layer 200a and the contact plug 300. In this regard, a malfunction of a nonvolatile memory device due to an electrical connection between the sub semiconductor layer 200a and the contact plug 300 may be prevented.

Some embodiments provide that word lines ($WL_{n/2}$~$WL_{n-1}$) and a string selection line (SSL) remaining in one cell string except for the word lines ($WL_0$~$WL_{n/2-1}$) that is formed on the first semiconductor layer 100 may be disposed on the second semiconductor layer 200. In some embodiments of the present invention, the second semiconductor layer 200 corresponds to the top layer of a plurality of semiconductor layers 100 and 200 and a string selection transistor is disposed on the top semiconductor layer 200.

In some embodiments, a disposition of the word lines ($WL_{n/2}$~$WL_{n-1}$) and the string selection line (SSL) on the second semiconductor layer 200 may be equal to the disposition of the word lines ($WL_0$~$WL_{n/2-1}$) and the ground selection line (GSL). Some embodiments provide that the word lines ($WL_{n/2}$~$WL_{n-1}$) are disposed from a position adjacent to the contact plug 300 directly connecting the memory cell transistors and the string selection line (SSL) may be disposed at a position most spaced apart from the contact plug 300.

Impurity regions 250 may be formed in the second semiconductor layer 200 between the word lines ($WL_{n/2}$~$WL_{n-1}$) and the string selection line (SSL). Some embodiments provide that an impurity region 250 formed on one side of the word lines ($WL_{n/2}$~$WL_{n-1}$) is connected to an impurity region 150 of the first semiconductor layer 100 through the contact plug 300. Also, an impurity region 250D formed on one side of the string selection line (SSL) may be connected to a bit line contact plug 265.

The word lines ($WL_{n/2}$~$WL_{n-1}$) and a string selection line (SSL) on the second semiconductor layer 200 may be covered with a third interlayer insulating layer 260 and the bit line contact plug 265 may be formed in the third interlayer insulating layer 260.

In some embodiments, bit lines 270 crossing the word lines ($WL_0$-$WL_{n-1}$) are disposed on a top surface of the third interlayer insulating layer 260, that is, the top surface of the structure in which the multiple semiconductor layers 100 and 200 are stacked. The bit lines 270 are spaced a predetermined distance apart from one another and disposed to be parallel to one another. Some embodiments provide that the bit lines 270 are electrically connected to each of the string selection transistors through the bit line contact plug 265.

In one cell string region (ST1), a nonvolatile memory device according to some embodiments of the present invention includes a cell string forming a current path in the stacked semiconductor layers 100 and 200.

Further, in some embodiments of the present invention, another cell string may be disposed to be symmetrical to a cell string formed on the plurality of stacked semiconductor layers 100 and 200 with respect to the common source line (CSL).

In detail, a nonvolatile memory device according to some embodiments of the present invention may include first and second cell string regions (ST1, ST2) arranged in a mirror symmetry. For example, the first and second cell string regions (ST1, ST2) may be arranged in symmetrical reference to a center of the common source line 165 and/or the bit line contact plug 265. The contact plug 300 connecting the memory cell transistors may be disposed on one side of each of the cell string regions (ST1, ST2) and the selection transistors (SSL, GSL) may be disposed on the other side of each of the cell string regions (ST1 ST2).

Impurity regions of the selection transistors (SSL, GSL) may be disposed in a center of the first and second cell string regions (ST1, ST2) symmetrically disposed to each other. In some embodiments, the selection transistors (SSL, GSL) disposed on the first and second cell string regions (ST1, ST2) may share the impurity regions. In other words, the first and second cell string regions (ST1, ST2) can share the common source line 165 in the first semiconductor layer 100 and the bit line contact plug 265 in the second semiconductor layer 200.

On each of the semiconductor layers 100 and 200, a dummy word line ($WL_d$) may be disposed on an interface of the cell string regions (ST1, ST2). When two cell strings are mirror symmetrical to each other, the dummy word line ($WL_d$) may be disposed on each of the two cell strings.

In each of the semiconductor layers 100 and 200, the dummy word line ($WL_d$) may be disposed on the device isolation layers 102 and 202, and/or on the active region and may have the same structure as the word line. When the dummy word line ($WL_d$) is disposed on the active region, the dummy word line ($WL_d$) may prevent an operation characteristic between adjacent cell strings from being disturbed while a nonvolatile memory device is operated.

Integration in a limited area may be doubled by forming one cell string that defines one current path on the first and second semiconductor layers 100 and 200.

Also, when one cell string is formed on each of the semiconductor layers 100 and 200, a length of a common source line and/or a bit line contact plug commonly connected to a plurality of cell strings may be increased. However, in some embodiments of the present invention, since ground selection transistors (GSL) of adjacent cell string regions are formed on a same layer, an increase in the height of the common source line 165 may be prevented. Also, since string selection transistors (SSL) of adjacent cell string regions are formed on a same layer, an increase of a height of the bit line contact plug 265 may be prevented.

Referring to FIGS. 3 and 4a through 4d, a method of manufacturing a nonvolatile memory device according to some embodiments of the present invention will be described.

FIGS. 4a through 4d are cross sectional views illustrating methods of manufacturing a contact plug included in a nonvolatile memory device according to some embodiments of the present invention.

Figure 4A:
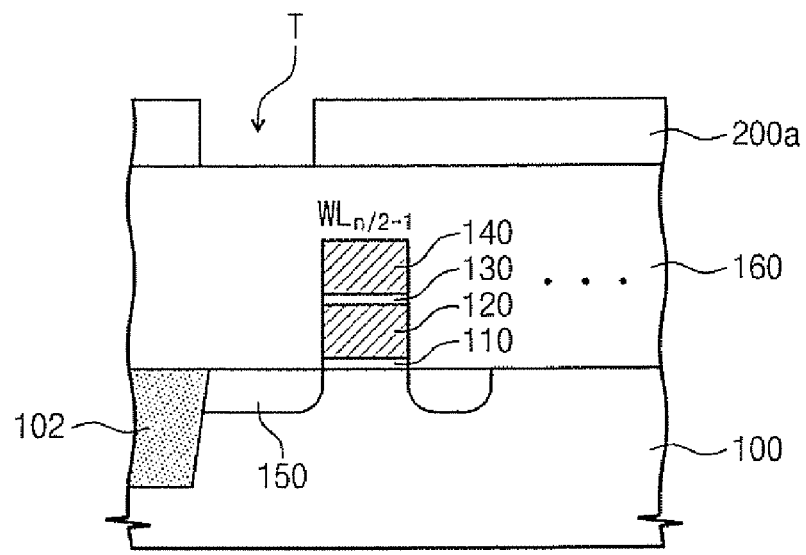
FIGS. 4a through 4d are cross sectional views illustrating methods of manufacturing a contact plug included in a nonvolatile memory device according to some embodiments of the present invention.

First, as depicted in FIGS. 3 and 4a, word lines ($WL_0$~$WL_{n/2-1}$) and a gate electrode of a string selection transistor or a ground selection transistor may be formed on a first semiconductor layer 100. After a tunnel insulating layer 110 and a conductive layer for a floating gate 120 are deposited on the first semiconductor layer 100, the tunnel insulating layer 110 and the conductive layer for a floating gate may be patterned to form floating gates 120 of an island shape. Subsequently, an intergate insulating layer 130 and a conductive layer for a control gate 140 may be deposited and then the intergate insulating layer 130 and the conductive layer for a control gate 140 are patterned in a linear shape to form a plurality of word lines ($WL_0 \sim WL_{n/2-1}$).

Some embodiments provide that after forming the word lines ($WL_0 \sim WL_{n/2-1}$), a first impurity region 150 is formed in the first semiconductor layer 100 between the word lines ($WL_0 \sim WL_{n/2-1}$).

A first interlayer insulating layer 160 covering the word lines ($WL_0 \sim WL_{n/2-1}$) and a ground selection line (GSL) is formed on the first semiconductor layer 100. A common source line 165, which penetrates the first interlayer insulating layer 160 and is in contact with an impurity region of one side of the ground selection line (GSL) may be formed. The common source line 165 is formed to be parallel to the word lines ($WL_0 \sim WL_{n/2-1}$). Accordingly, impurity regions 150S located on one side of the ground selection line may be electrically connected to one another.

After forming the common source line 165, a second interlayer insulating layer 170 may be formed on the first interlayer insulating layer 160. An upper portion of the second interlayer insulating layer 170 may be planarized and a sub semiconductor layer 200a may be bonded to the top surface of the second interlayer insulating layer 170. Some embodiments provide that the sub semiconductor layer 200a may be a single crystalline silicon substrate.

After bonding the sub semiconductor layer 200a onto the second interlayer insulating layer 170, an opening (T) may be formed at a position where a contact plug 300 is connected. That is, at the first semiconductor layer 100, the opening (T) may be formed on an impurity region 150 of an edge of memory cell transistors that are serially connected to one another.

Figure 4B:
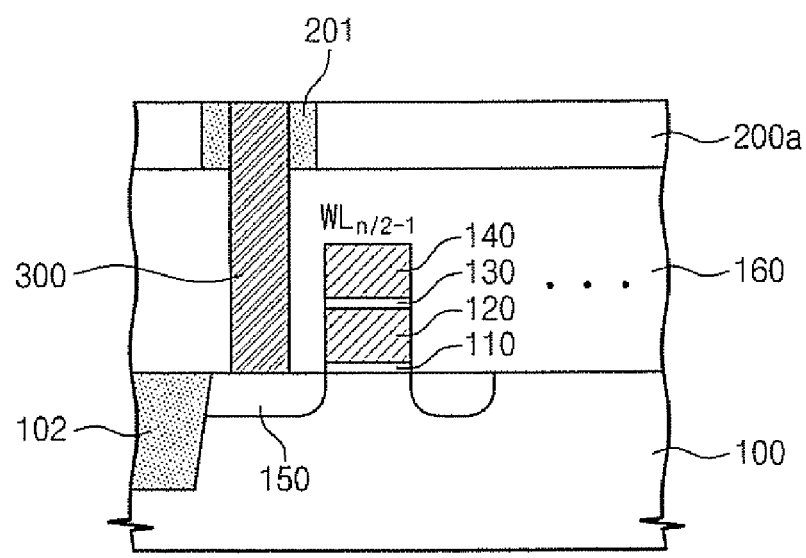

After forming the opening (T) in the sub semiconductor layer 200a, as depicted in FIG. 4b, the opening (T) may be filled with an insulating layer 201. A mask pattern (not shown) for forming a contact hole is formed on the sub semiconductor layer 200a and the contact hole is formed using the mask pattern to expose the impurity region 150 of the first semiconductor layer 100. A conductive material may fill the contact hole and be planarized to form a contact plug 300 connected to the impurity region 150 of the first semiconductor layer 100.

Here, the insulating layer 201 formed in the sub semiconductor layer 200a may insulate an electric connection between the contact plug 300 and the sub semiconductor layer 200a.

Figure 4C:
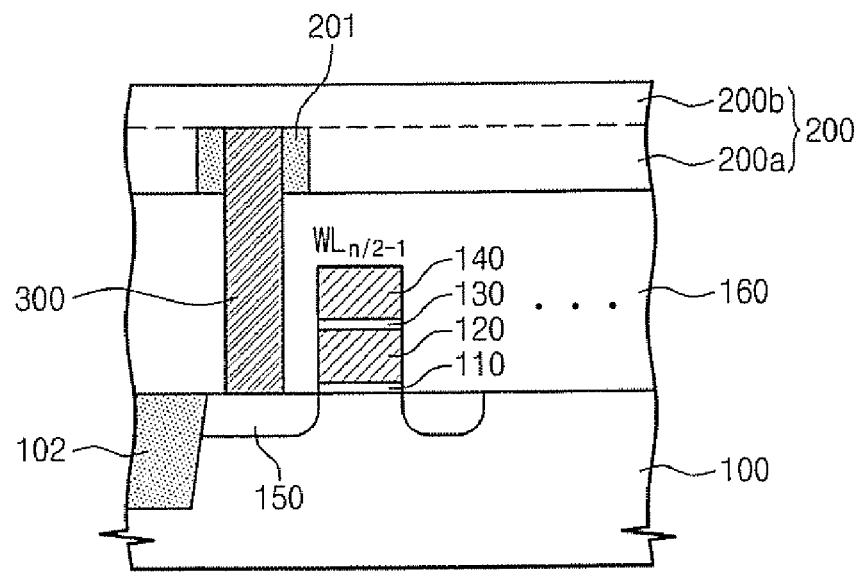

After forming the contact plug 300, as depicted in FIG. 4c, an epitaxy layer 200b may be formed on the sub semiconductor layer 200a. In some embodiments, the epitaxy layer 200b may be formed through an epitaxial process using the sub semiconductor layer 200a as a seed layer. The epitaxy layer 200b may have a single crystalline structure and may grow on the insulating layer 201 and the contact plug 300. Some embodiments provide that a second semiconductor layer 200 comprised of the sub semiconductor layer 200a and the epitaxy layer 200b may be formed on the second interlayer insulating layer 170.

Figure 4D:
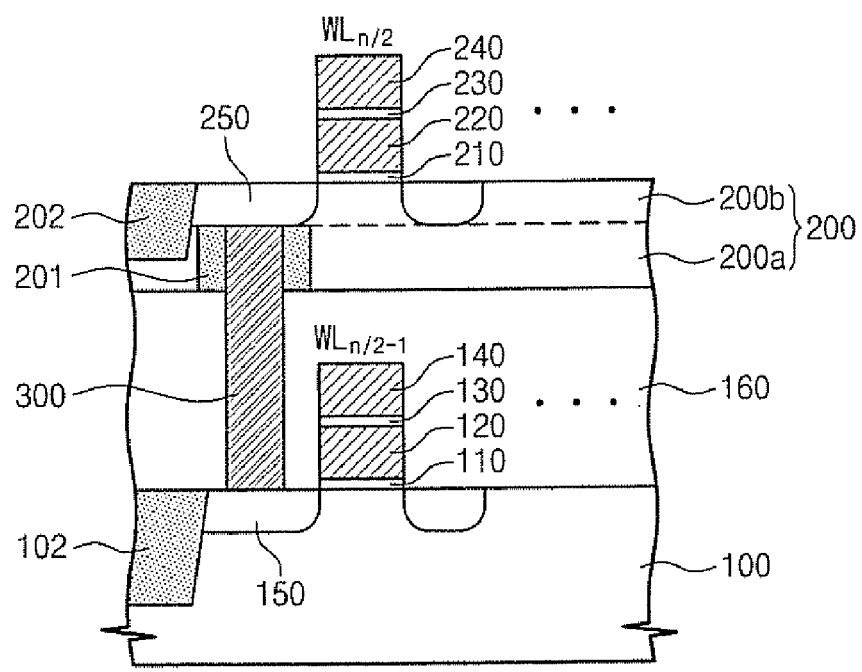

Referring to FIG. 4d, a device isolation layer 202 may be formed in the second semiconductor layer 200 to define active regions. The active regions of the second semiconductor layer 200 may have the same disposition structure as the active regions of the first semiconductor layer 100.

A plurality of word lines ($WL_{n/2} \sim WL_{n-1}$) and a string selection line (SSL) may be formed on the second semiconductor layer 200. Methods of forming a plurality of the word lines ($WL_{n/2} \sim WL_{n-1}$) and the string selection line (SSL) may be same as methods of forming a plurality of the word lines ($WL_0 \sim WL_{n/2-1}$) and the ground selection line (GSL) of the first semiconductor layer 100.

Impurity regions 250 are formed between the word lines ($WL_{n/2} \sim WL_{n-1}$) and between the word lines and the string selection line (SSL). A depth of the impurity regions 250 is controlled so that the impurity region 250 is in contact with a top surface of the contact plug 300.

Figure 5:
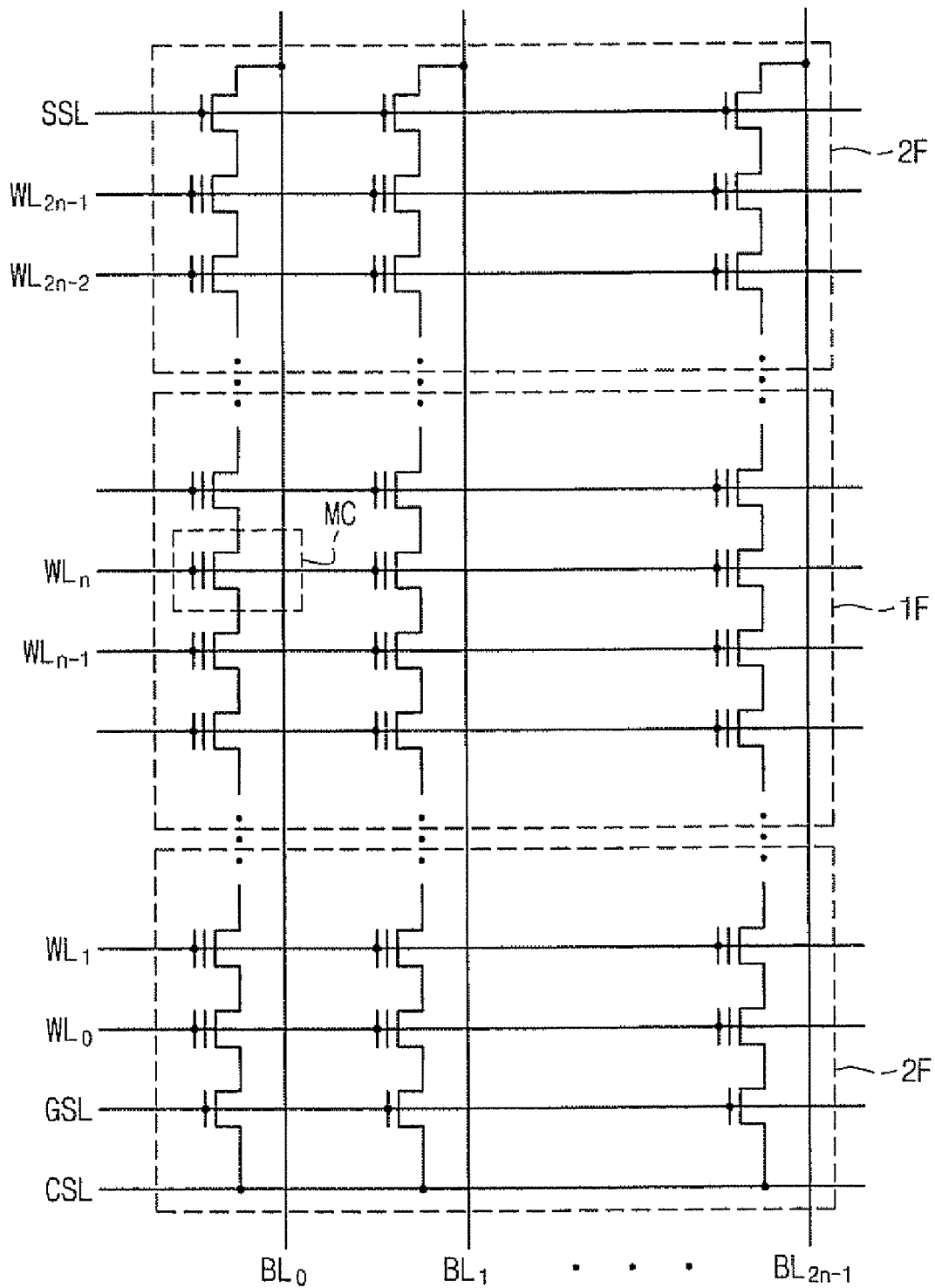
FIG. 5 is a circuit diagram of nonvolatile memory devices according to some embodiments of the present invention.
Figure 6:
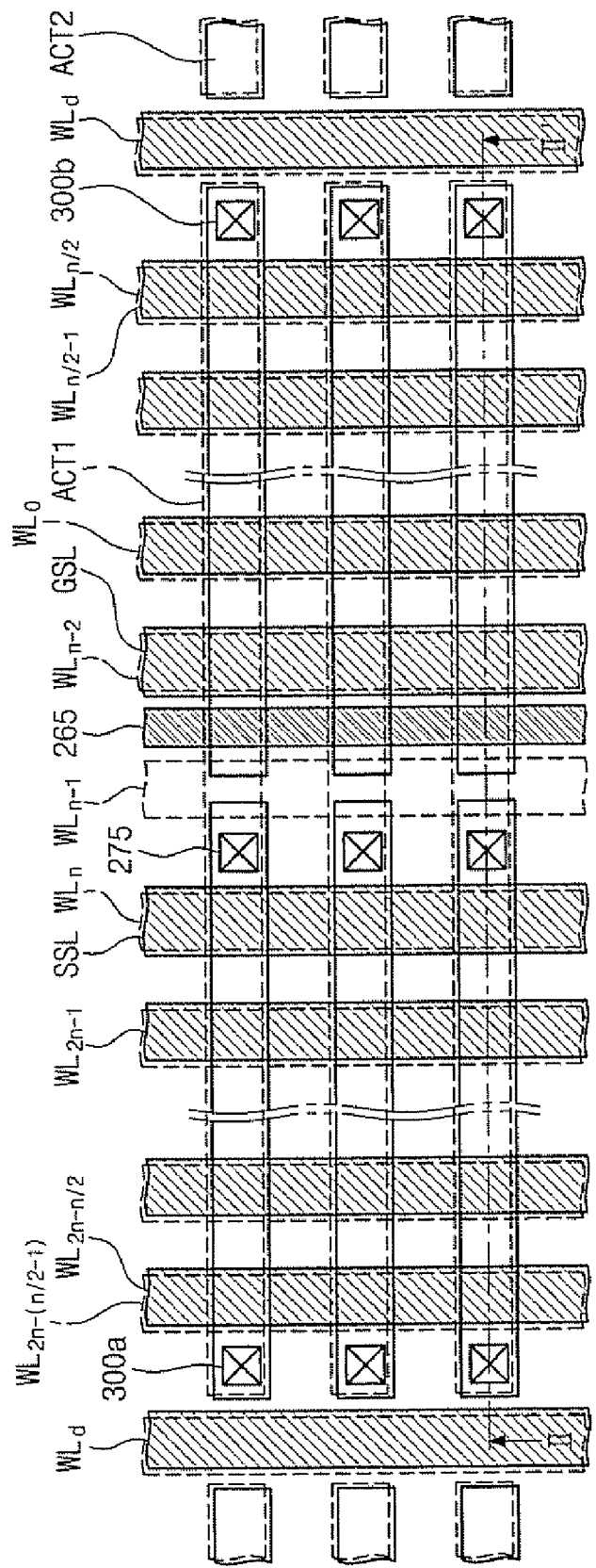
FIG. 6 is a top plan view of a nonvolatile memory device according to some embodiments of the present invention.
Figure 7:
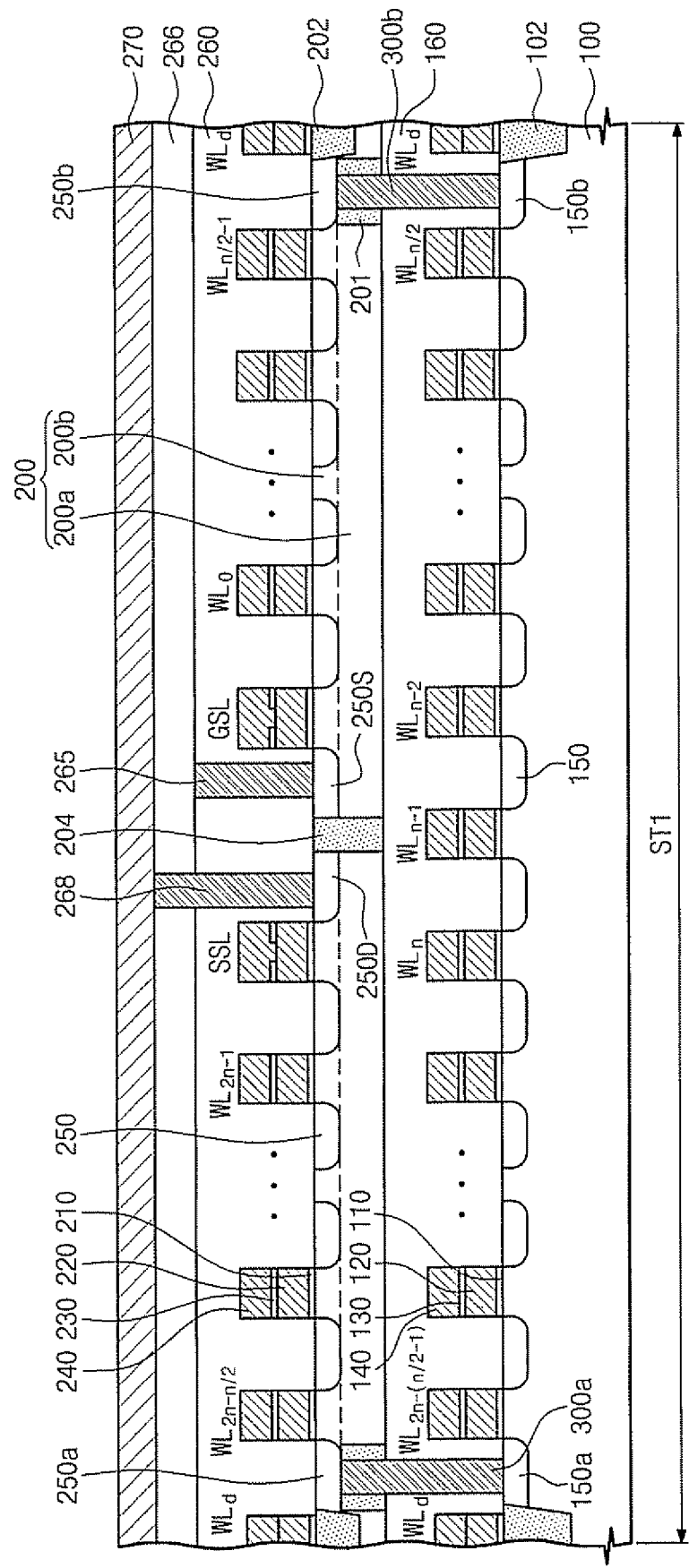
FIG. 7 is a cross sectional view of a nonvolatile memory device according to some embodiments of the present invention taken along the line II-II' of FIG. 6.

Referring to FIGS. 5 through 7, a nonvolatile memory device according to some embodiments of the present invention will be described in detail. The description of common features already discussed in embodiments herein will be omitted for brevity.

FIG. 5 is a circuit diagram of a nonvolatile memory device according to some embodiments of the present invention. FIG. 6 is a top plan view of a nonvolatile memory device according to some embodiments of the present invention. FIG. 7 is a cross sectional view of a nonvolatile memory device according to some embodiments of the present invention taken along the line II-II' of FIG. 6.

Referring to FIG. 5, one cell string of a cell array according to some embodiments of the present invention may include 2n quantity of memory cell transistors (MC). Here, n is a positive number and may be a multiple of 8. 2n quantity of memory cell transistors (MC) may be serially connected to one another in each cell string. A string selection transistor and a ground selection transistor may be serially connected to both edges of each cell string, respectively.

A cell array may include a string selection line (SSL), a ground selection line (GSL) and 2n quantity of word lines ($WL_{2n-1}$) disposed between the string selection line (SSL) and the ground selection line (GSL). In some embodiments, a cell array may also include 2n quantity of bit lines ($BL_{2n-1}$), which are disposed to cross the word lines ($WL_{2n-1}$) and are connected to drains of string selection transistors. Some embodiments provide that sources of ground selection transistors connected to cell strings are commonly connected to one another to form a common source line (CSL).

As the quantity of word lines ($WL_{2n-1}$) included in one cell string increases, the one cell string may be divided into a predetermined units (1F, 2F) and the divided units (1F, 2F) may be disposed on different semiconductor layers. In some embodiments, both edges of a cell string and a center of a cell string may be disposed on different semiconductor layers.

As will be described later in detail, when two semiconductor layers are stacked, both edge portions of a cell string may be disposed on a semiconductor layer located at an upper portion and a center portion of a cell string may be disposed on a semiconductor layer located at a lower portion.

Referring to FIGS. 6 and 7, a disposition structure of a nonvolatile memory device according to some embodiments of the present invention will be described in detail.

Referring to FIGS. 6 and 7, a nonvolatile memory device according to some embodiments of the present invention includes a first semiconductor layer 100 and a second semiconductor layer 200, which are stacked.

Some embodiments provide that the first semiconductor layer 100 may be a single crystalline wafer and/or a single crystalline epitaxy layer. A device isolation layer 102 may be formed in the first semiconductor layer 100 to define an active region (ACT1) having a generally linear shape.

In some embodiments, a plurality of word lines ($WL_{n/2}$~$WL_{2n-(n/2-1)}$) crossing an active region (ACT1) are disposed on the first semiconductor layer 100. A plurality of the word lines ($WL_{n/2}$~$WL_{2n-(n/2-1)}$) disposed on the first semiconductor layer 100 are a portion of the 2n quantity of memory cell transistors constituting one cell string. For example, n quantity of memory cell transistors among 2n quantity of memory cell transistors may be disposed on the first semiconductor layer 100. As a portion of one cell string, n quantity memory cell transistors may be disposed on the first semiconductor layer 100.

Word lines ($WL_{n/2}$~$WL_{2n-(n/2-1)}$) formed on the first semiconductor layer 100 may include a gate pattern formed by a tunnel insulating layer 110, a floating gate 120, an intergate insulating layer 130 and/or a control gate 140 that are stacked. The word lines ($WL_{n/2}$~$WL_{2n-(n/2-1)}$) may also include a gate pattern formed by a charge tunneling layer, a charge trap layer, a charge blocking layer and/or a gate electrode layer that are stacked.

Impurity regions 150 may be formed in the first semiconductor layer 100 between the word lines ($WL_{n/2}$~$WL_{2n-(n/2-1)}$). In this regard, memory cell transistors disposed on the first semiconductor layer 100 may be serially connected to one another through the impurity region 150. Impurity regions 150a and 150b disposed on both edge portions of a cell string region (ST1) may be connected to contact plugs 300a and 300b electrically connecting the memory cell transistors to one another. Memory cell transistors formed on different semiconductor layers 100 and 200 may be serially connected to one another through the contact plugs 300a and 300b to form one cell string.

In another embodiment, since both edge portions of one cell string that includes multiple memory cell transistors serially connected to one another has a folded structure, contact plugs 300a and 300b may be disposed on both edge portions of the cell string region (ST1).

More specifically, the contact plugs 300a and 300b may be vertically extended from the impurity regions 150a and 150b formed in the first semiconductor layer 100 to impurity regions 250a and 250b formed in the second semiconductor layer 200. The contact plugs 300a and 300b penetrate a portion of the second semiconductor layer 200 and top surfaces of the contact plugs 300a and 300b may be in contact with the impurity regions 250a and 250b formed in the second semiconductor layer 200.

The second semiconductor layer is stacked on a first interlayer insulating layer 160 burying the word lines ($WL_{n/2}$~$WL_{2/n-(n/2-1)}$) on the first semiconductor layer. The second semiconductor layer 200 may have a structure wherein a sub semiconductor layer 200a and an epitaxy layer 200b are stacked.

A device isolation layer 202 may be formed in the second semiconductor layer 200 to define an active region (ACT2) having a generally linear shape. The active region (ACT2) of the second semiconductor layer 200 may have substantially the same pattern as the active region (ACT1) of the first semiconductor layer 100. In some embodiments, the shape of the active region (ACT2) of the second semiconductor layer 200 may provide that a center of the active region (ACT2) of the second semiconductor layer 200 is cut by an insulating layer pattern 204 substantially performing the same function as the device isolation layer 202. One cell string region (ST1) of the first semiconductor layer 100 may include one active region (ACT1) having a generally linear shape. Some embodiments provide that one string region of the second semiconductor layer 200 may include two active regions (ACT2) when viewed from a major axis direction. Thus, a length of the active region (ACT2) defined in the second semiconductor layer 200 may be smaller than a length of the active region (ACT1) defined in the first semiconductor layer 100.

Remaining word lines ($WL_0$~$WL_{n/2-1}$, $WL_{2n-n/2}$~$WL_{2n-1}$) of one cell string except for the word lines ($W_{n/2}$~$WL_{2n-(n/2-1)}$) formed on the first semiconductor layer 100, a string selection line (SSL) and a ground selection line (GSL) may be disposed on the second semiconductor layer 200.

At a center portion of the cell string region (ST1) of the second semiconductor layer 200, a string selection line (SSL) and a ground selection line (GSL) may be disposed on both sides of the insulating layer pattern 204. Word lines are disposed from one side of a string selection line (SSL) and the other side of a ground selection line (CSL).

Impurity regions 250 may be formed among word lines (WLn), a string selection line (SSL) and a ground selection line (GSL). The string selection line (SSL) and the word lines ($WL_{2n-n/2}$~$WL_{2n-1}$) may be serially connected and the ground selection line (GSL) and the word lines ($WL_{2n-n/2}$~$WL_{2n-1}$) may be serially connected.

At the cell string (ST1), impurity regions 250a and 250b disposed in both edges of the second semiconductor layer 200 may be formed to be connected to the contact plugs 300a and 300b connected to the impurity regions 150a and 150b of the first semiconductor layer 100.

The impurity region 150a of a memory cell transistor disposed in one side edge of the first semiconductor layer 100 may be serially connected to the impurity region 250a of a memory cell transistor disposed in one side edge of the second semiconductor layer 200 through the contact plug 300a.

The impurity region 150b of a memory cell transistor disposed in the other side edge of the first semiconductor layer 100 may be serially connected to the impurity region 250b of a memory cell transistor disposed in the other side edge of the second semiconductor layer 200 through the contact plug 300b.

The insulating layer pattern 204 may be formed between the string selection line (SSL) and the ground selection line (GSL) to electrically insulate the string selection line (SSL) and the ground selection line (GSL).

An impurity region 250D formed at one side of the string selection line (SSL) may be a drain electrode and may be connected to a bit line 270 through a bit line plug 268. An impurity region 250S formed at one side of the ground selection line (GSL) may be a source electrode and may be connected to a common source line 265. Dummy word lines (WLd) may be formed on the semiconductor layers 100 and 200 at interfaces of cell strings (ST).

At one cell string, integration in a limited area may be doubled by forming both edge portions on the second semiconductor layer 200 and forming a center portion on the first semiconductor layer 100. An increase of a height of a bit line contact plug 268 and the common source line 265 may be prevented by disposing selection transistors connected to both edges of a cell string on an upper portion. When manufacturing a nonvolatile semiconductor device, a contact plug process may be simplified.

Figure 8:
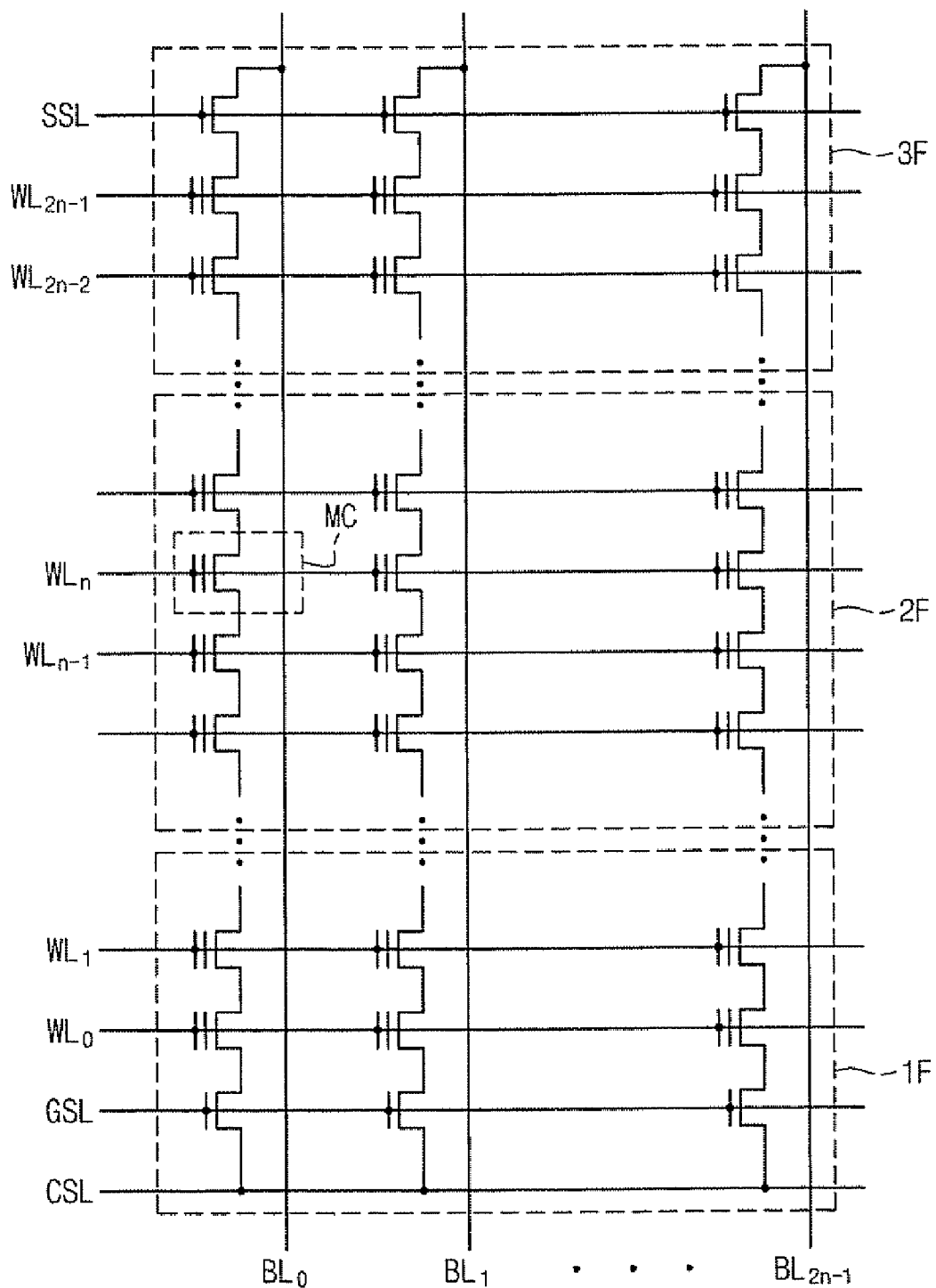
FIG. 8 is a circuit diagram of a nonvolatile memory device according to some embodiments of the present invention.
Figure 9:
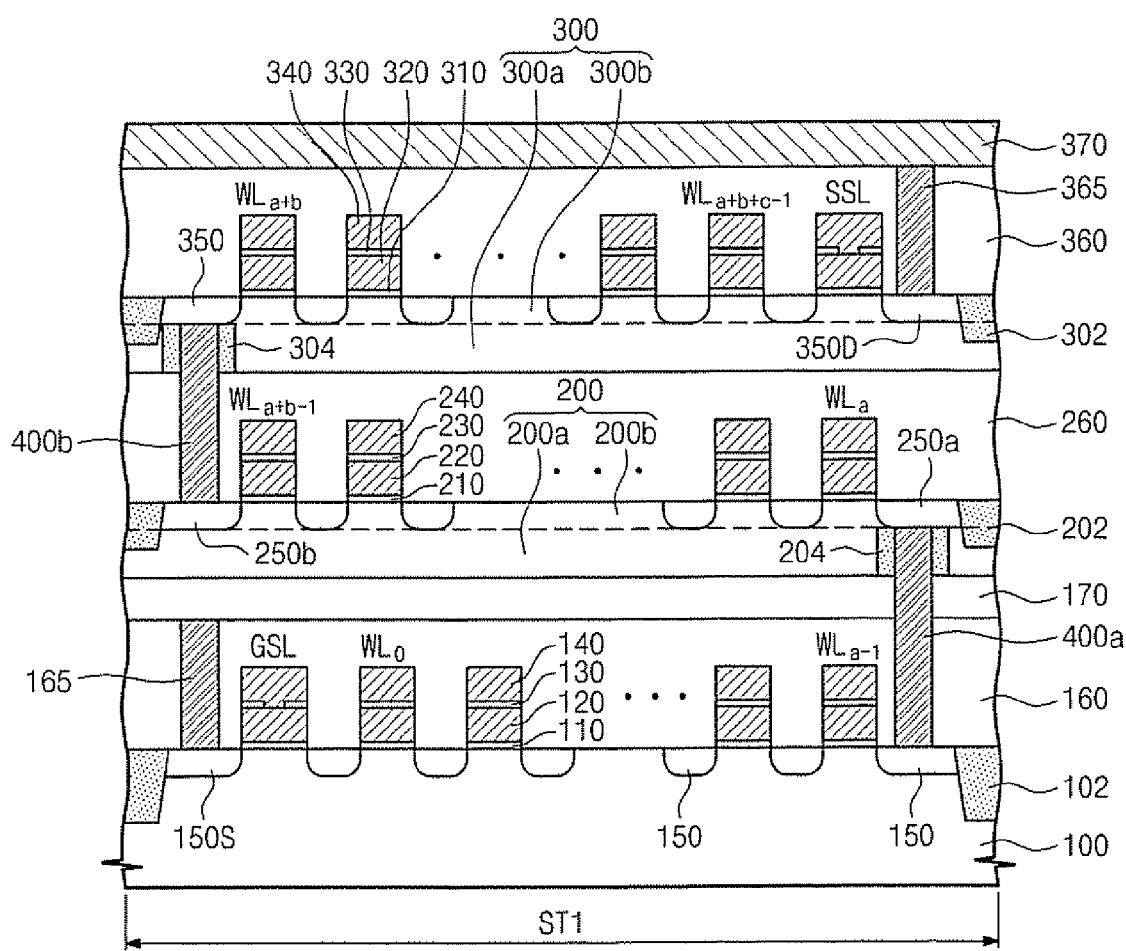
FIG. 9 is a cross sectional view of a nonvolatile memory device according to some embodiments of the present invention.

Referring to FIGS. 8 and 9, a nonvolatile memory device according to still another embodiment will be described in detail. The description of common features already discussed in embodiments described herein will be omitted for brevity.

FIG. 8 is a circuit diagram of a nonvolatile memory device according to some embodiments of the present invention.

FIG. 9 is a cross sectional view of a nonvolatile memory device according to some embodiments of the present invention.

Referring to FIG. 8, a cell array of a nonvolatile memory device according to some embodiments is substantially similar to the cell array depicted in FIG. 4. One cell string comprised of 2n quantity of memory cell transistors is divided into a predetermined unit (1F, 2F, 3F) and the divided units (1F, 2F, 3F) may be disposed on different semiconductor layers. As the quantity of stacked semiconductor layers increases, an area occupied by one cell string can be reduced. Accordingly, a nonvolatile memory device having a high capacity and a high integration may be embodied.

In FIG. 9, a nonvolatile memory device according to some embodiments may have a structure that includes first, second and third semiconductor layers 100, 200 and 300 that are stacked.

Device isolation layers 102, 202 and 302 may be formed in the first, second and third semiconductor layers 100, 200 and 300 to define active regions. The active regions defined by the first, second and third semiconductor layers 100, 200 and 300 may have the same shape. The active regions having a generally linear shape may be defined in the first, second and third semiconductor layers 100, 200 and 300.

At one cell string region (ST1), 2n quantity of memory cell transistors may be disposed on the first, second and third semiconductor layers 100, 200 and 300. In such embodiments, n is a positive number and may be a multiple of 8. That is, 2n number of memory cell transistors is properly divided to be disposed on each of the first, second and third semiconductor layers 100, 200 and 300.

At the cell string region (ST1), "a" quantity of memory cell transistors may be disposed on the first semiconductor, "b" quantity of memory cell transistors may be disposed on the second semiconductor and "ct" quantity of memory cell transistors may be disposed on the third semiconductor. Accordingly, "a", "b" and "c" are positive numbers and a+b+c is 2n.

Among the first, second and third semiconductor layers 100, 200 and 300, a string selection line (SSL) and a ground selection line (GSL) may be disposed on the first semiconductor layer 100 corresponding to the lowest layer and the third semiconductor layer 300 corresponding to the highest layer, respectively.

More specifically, in some embodiments, a ground selection line (GSL) and "a" quantity of word lines ($WL_0 \sim WL_{a-1}$) may be disposed on the first semiconductor layer 100. Some embodiments provide that "b" quantity of word lines ($WL_a \sim WL_{a+b-1}$) may be disposed on the second semiconductor layer 200. A string selection line (SSL) and "c" number of word lines ($WL_{a+b} \sim W_{a+b+c-1}$) may be disposed on the third semiconductor layer 300. In this regard, 2n quantity of word lines may be disposed on the first, second and third semiconductor layers 100, 200 and 300.

An impurity region 150S formed at one side of the ground selection line (CSL) of the first semiconductor layer 100 may be a source electrode and may be electrically connected to a common source line 165. The common source line 165 may be formed in a first interlayer insulating layer 160 formed on the first semiconductor layer 100 and may be commonly connected to impurity regions of other ground selection lines (GSL).

An impurity region 150 of one side of a word line ($WL_{a-1}$) disposed at an edge of the first semiconductor layer 100 may be connected to a contact plug 400a that serially connects memory cell transistors. The contact plug 400a extends from the first semiconductor layer 100 to the second semiconductor layer 200 and may be electrically connected to an impurity region 250a disposed at an edge of one side of the second semiconductor layer 200. A contact plug 400b may be electrically connected to an impurity region 250b of one side of a word line ($WL_{a+b-1}$) disposed at an edge of the other side of the second semiconductor layer 200.

An impurity region 350 of one side of a word line (WLa+b) disposed at an edge of the third semiconductor layer 300 may be electrically connected to the contact plug 400b that is electrically connected to an impurity region 250b of the second semiconductor layer 200. An impurity region 350D on one side of a string selection line (SSL) on the third semiconductor layer 300 may be connected to a bit line 370 through a bit line contact plug 365.

In some embodiments, the contact plugs 400a and 400b electrically connecting 2n quantity of memory cell transistors disposed on the first, second and third semiconductor layers 100, 200 and 300 may disposed on different vertical lines.

At the cell string region (ST1), a cell string forming one current path on a plurality of semiconductor layers 100, 200 and 300 can be embodied by stacking a plurality of semiconductor layers 100, 200 and 300 on which memory cell transistors are serially connected and serially connecting memory cell transistors disposed on each semiconductor layer through the contact plugs 400a and 400b.

Integration in a limited area may be doubled by increasing the number of stacked semiconductor layers and forming one cell string including memory cell transistors that are serially connected on a plurality of semiconductor layers.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the embodiments disclosed herein, and that modifications to the disclosed embodiments, as well as other embodiments, are intended to be included within the scope of the appended claims. The present invention is defined by the following claims.

What is claimed is:

1. A nonvolatile memory device comprising:
a plurality of stacked semiconductor layers;
a cell string including a plurality of memory cell transistors that are formed on each of the plurality of stacked semiconductor layers and that are serially connected, the memory cell transistors disposed on different ones of the plurality of stacked semiconductor layers being serially connected to form one current path in the plurality of stacked semiconductor layers;
a first selection transistor that is serially connected to a first end portion of the cell string; and
a second selection transistor that is serially connected to the other end portion of the cell string.

2. The nonvolatile memory device of claim 1, farther comprising a contact plug disposed between ones of the plurality of stacked semiconductor layers to serially connect memory cell transistors disposed on different ones of the plurality of stacked semiconductor layers.

3. The nonvolatile memory device of claim 2, wherein the contact plug is inserted into a semiconductor layer disposed on an upper portion of the contact plug and is in contact with a lower portion of an impurity region of memory cell transistor disposed in the semiconductor layer.

4. The nonvolatile memory device of claim 3, further comprising an insulating layer formed around the contact plug inserted into the semiconductor layer.

5. The nonvolatile memory device of claim 1, wherein the first and second selection transistors are disposed on a same one of the plurality of stacked semiconductor layers.

6. The nonvolatile memory device of claim 5, wherein at least one of the plurality of stacked semiconductor layers includes at least a portion of the plurality of memory cell transistors serially connected without including the first and second selection transistors.

7. The nonvolatile memory device of claim 1, further comprising an insulating layer pattern formed on the one of the plurality of stacked semiconductor layers on which the first and second selection transistors are disposed and between the first and second transistors, wherein the first and second selection transistors are adjacently disposed.

8. The nonvolatile memory device of claim 1, wherein the first and second selection transistors are disposed on different ones of the plurality of stacked semiconductor layers.

9. The nonvolatile memory device of claim 8, wherein the first and second selection transistors are disposed on a same vertical line.

10. The nonvolatile memory device of claim 8, wherein the first and second selection transistors are disposed on the highest layer and the lowest layer of the plurality of stacked semiconductor layers, respectively.

11. The nonvolatile memory device of claim 10, wherein one of the plurality of semiconductor layers is disposed between the highest layer and the lowest layer and includes a plurality of memory cell transistors serially connected.

12. The nonvolatile memory device of claim 1, further comprises:
    a common source line connected to the first selection transistor; and
    a bit line contact plug connected to the second selection transistor,
    wherein a height of the common source line and/or the bit line contact plug is less than a distance between ones of the plurality of stacked semiconductor layers.

13. The nonvolatile memory device of claim 12, wherein the common source line and the bit line contact plugs are connected to different impurity regions formed in different ones of the plurality of stacked semiconductor layers, respectively.

14. The nonvolatile memory device of claim 13, wherein the common source line and the bit line contact plugs are disposed on a same vertical line.

15. The nonvolatile memory device of claim 12, wherein the common source line and the bit line contact plugs are connected to impurity regions formed in a same one of the plurality of stacked semiconductor layers.

16. The nonvolatile memory device of claim 12, further comprising a plurality of cell strings that are arranged in mirror symmetry relative to one another.

17. The nonvolatile memory device of claim 16, wherein the adjacent cell strings arranged in mirror symmetry share the common source line and the bit line contact plug.

18. A nonvolatile memory device comprising a plurality of stacked semiconductor layers including a plurality of cell string regions, wherein each of the cell string regions comprises:
    one cell string including a plurality of memory cell transistors which are formed in each of the plurality of stacked semiconductor layers and serially connected, the memory cell transistors disposed on different ones of the plurality of stacked semiconductor layers being serially connected to form one current path in the plurality of the semiconductor layers;
    a first selection transistor serially connected to one edge portion of the cell string; and
    a second selection transistor serially connected to the other edge portion of the cell string.

19. The nonvolatile memory device of claim 18, wherein the first and second selection transistors are disposed on a center of the cell string region.

20. The nonvolatile memory device of claim 18, further comprising a contact plug which is disposed on an edge of the cell string region to serially connect memory cell transistors of different ones of the plurality of stacked semiconductor layers.

* * * * *